(12) United States Patent
Chang

(10) Patent No.: US 6,579,810 B2
(45) Date of Patent: Jun. 17, 2003

(54) METHOD OF REMOVING A PHOTORESIST LAYER ON A SEMICONDUCTOR WAFER

(75) Inventor: Ching-Yu Chang, I-Lan Hsien (TW)

(73) Assignee: Macronix International Co. Ltd., Hsin-Chu (TW)

( * ) Notice: Subject to any disclaimer, the term of this patent is extended or adjusted under 35 U.S.C. 154(b) by 47 days.

(21) Appl. No.: 09/885,038

(22) Filed: Jun. 21, 2001

(65) Prior Publication Data

US 2002/0197887 A1 Dec. 26, 2002

(51) Int. Cl.[7] .............................................. H01L 21/302
(52) U.S. Cl. ................ 438/745; 134/1; 134/2; 134/3; 134/95.3; 134/103.1; 438/748; 438/749; 438/750
(58) Field of Search .............................. 438/784; 134/1, 134/2, 3, 95.3, 103.1, 105, 184, 201; 458/748, 749, 780

(56) References Cited

U.S. PATENT DOCUMENTS 5,505,785 A * 4/1996 Ferrell ............................ 134/1
6,273,108 B1 * 8/2001 Bergman et al. ......... 134/102.1

* cited by examiner

Primary Examiner—Hoai Ho
Assistant Examiner—Reneé R Berry
(74) Attorney, Agent, or Firm—Winston Hsu

(57) ABSTRACT

A method of removing a photoresist layer on a semiconductor wafer starts with placing the semiconductor wafer into a dry strip chamber. A dry stripping process is performed to remove the photoresist layer on the semiconductor wafer. The semiconductor wafer is then placed on a rotator of a wet clean chamber and horizontally rotated. A first cleaning process is performed to remove polymers and organic components on a surface of the semiconductor wafer. Then a second cleaning process is performed as well to remove polymers and particles on the surface of the semiconductor wafer. By performing a third cleaning process, a first cleaning solution employed in the first cleaning process and a second cleaning solution employed in the second cleaning process are removed from the surface of the semiconductor wafer. Finally, the semiconductor wafer is spun dry at the end of the method.

14 Claims, 1 Drawing Sheet

METHOD OF REMOVING A PHOTORESIST LAYER ON A SEMICONDUCTOR WAFER

BACKGROUND OF THE INVENTION

1. Field of the invention

The present invention relates to a method of removing a photoresist layer on a semiconductor wafer, and more specifically, to a method of removing a photoresist layer on a semiconductor for a production of a small quantity.

2. Description of the Prior Art

In semiconductor manufacturing, a development process is performed to transfer the pattern of a photoresist layer onto a semiconductor wafer after the exposure process and the post exposure baking process. Normally the development process starts with pre-wetting the semiconductor wafer using DI water. A developer is then sprayed on the semiconductor wafer to perform a puddle development process. Finally, the photoresist layer is removed at the end of the development process.

The method of removing the photoresist layer on the semiconductor wafer starts with placing a batch of semiconductor wafers into a dry strip chamber. An ashing process, using a plasma comprising oxygen or ozone, is performed to remove the photoresist layer on each semiconductor wafer. There are normally 24 pieces of the semiconductor wafer per batch. Thus the duration of the ashing process is approximately 30 minutes per batch.

Since the photoresist layer comprises polymeric resins, photo-sensitizers and organic solvents, there are often residual polymers, organic components and particles on the surface of the semiconductor wafer after the ashing process. Thus the batch of the semiconductor wafers is then placed into a first rinse tank. A first rinse process, using a solution of sulfuric acid ($H_2SO_4$) and hydrogen peroxide ($H_2O_2$) as a first rinse solution and having a duration of 15 minutes per batch, is performed to remove polymers and organic components on each semiconductor wafer.

The batch of semiconductor wafers is then placed into a second rinse tank. A second rinse process, using DI water as a second rinse solution and having a duration of 10 minutes per batch, is performed to remove the residual first rinse solution on each semiconductor wafer.

Then, the batch of semiconductor wafers is placed into a third rinse tank. A third rinse process, using a standard cleaning solution (SC-1) as a third rinse solution and having a duration of 10 minutes per batch, is performed to remove organic components and particles on each semiconductor wafer.

The batch of the semiconductor wafers is then placed into a fourth rinse tank. A fourth rinse process, using DI water as a fourth rinse solution and having an approximate duration of 10 minutes per batch, is performed to remove the acid in the residual third rinse solutions on each semiconductor wafer.

Finally, the batch of semiconductor wafers is spun dry in a horizontal rotational plane at a rate ranging from 2000 to 2500 rpm for approximately 15 seconds per piece, so the duration of spinning dry the batch of the semiconductor wafers is approximately 6 minutes. Consequently, the method of removing the photoresist layer on the surface of each semiconductor wafer, including the ashing process, the first, second and third rinse processes, the spin-dry process and procedures of moving the batch of the semiconductors from tank to tank, has an approximate duration of 2 hours.

However, the method of removing a photoresist layer from a semiconductor wafer according to the prior art is merely efficient in batch production. In production with a small quantity, such as a pilot-run production, the duration of removing the photoresist layer from the semiconductor wafer is still approximately 2 hours even with a quantity of only single or a few semiconductor wafers. The manufacturing cost is thus increased by this inefficient production.

SUMMARY OF THE INVENTION

It is therefore a primary object of the present invention to provide a method of removing a photoresist layer from a semiconductor wafer in a production with a small quantity so as to improve the production efficiency.

According to the claimed invention, a semiconductor wafer is placed into a dry strip chamber. A dry stripping process is performed to remove a photoresist layer on the semiconductor wafer. The semiconductor wafer is then placed on a rotator of a wet clean chamber, comprising multiple nozzles, and rotated horizontally. A cleaning process, comprising a first, second, third and fourth cleaning processes and having a total duration of 140 seconds, is then performed. Finally, the semiconductor wafer is spun dry for approximately 20 seconds at the end of the method.

It is an advantage of the present invention against the prior art that the photoresist layer is removed by spraying the cleaning solutions onto the surface of the rotating semiconductor wafer instead of by rinsing the semiconductor wafer according to the prior art. In a production with a small quantity, such as a pilot-run production with a quantity of only single or few semiconductor wafers, the duration of removing the photoresist layer on the semiconductor wafer is only less than 4 minutes for each piece. Thus the production efficiency is significantly improved, and the production cost is consequently reduced.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
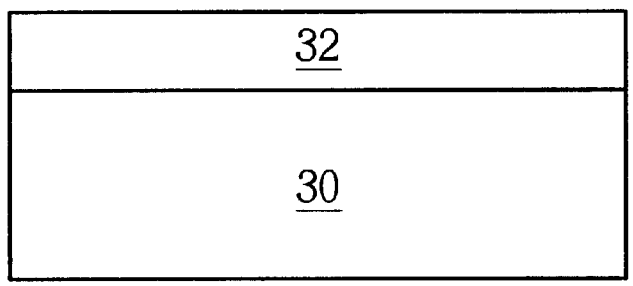
FIG. 1 and FIG. 2 are schematic views of removing a photoresist layer on a surface of a semiconductor wafer according to the present invention.
Figure 2:
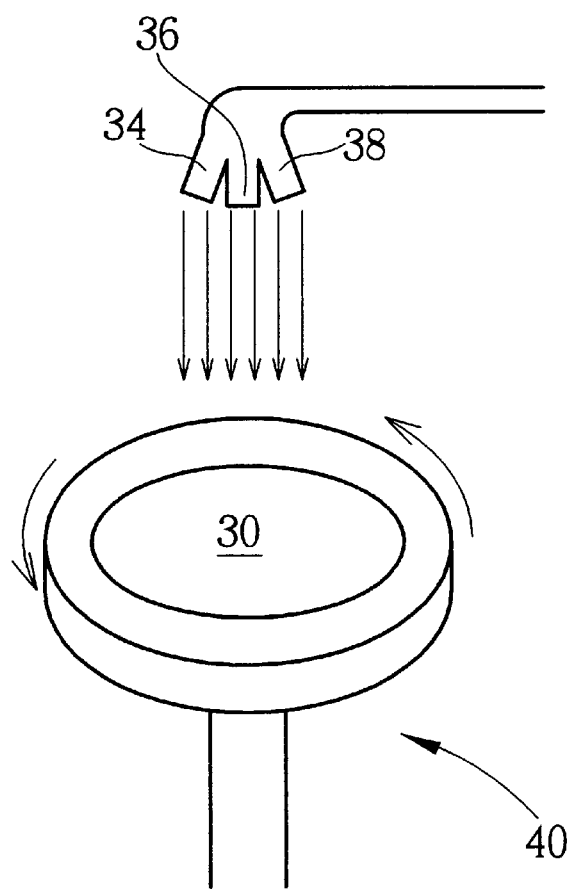

Please refer to FIG. 1 and FIG. 2 of schematic views of removing a photoresist layer on a surface of a semiconductor wafer according to the present invention. As shown in FIG. 1, a semiconductor wafer 30 comprises a photoresist layer 32 and other devices (not shown). The formation of the other devices is not the primary object of the present invention and is thus omitted. At the beginning of the method, the semiconductor wafer 30 is placed into a dry strip chamber. A dry stripping process, an ashing process using a plasma comprising oxygen or ozone, is performed to remove the photoresist layer 32 on the semiconductor wafer 30.

Since the photoresist layer 32 comprises polymeric resins, photo-sensitizers and organic solvents, and often residual polymers, organic components and particles that are left on the surface of the semiconductor wafer 30 after the ashing process. As shown in FIG. 2, the semiconductor wafer 30 is then placed on a rotator 40 of a wet clean chamber, comprising nozzles 34, 36 and 38, and rotated horizontally. The nozzles 34, 36 and 38 are employed to spray a first, second and third solutions onto the surface of semiconductor wafer, respectively, in subsequent cleaning processes. Alternatively, the nozzles 34, 36 and 38 are designed as a single nozzle connected to different tanks containing different cleaning solutions.

A first cleaning process, utilizing a horizontal rotational rate of the semiconductor wafer 30 ranging from 500 to 2500 rpm and having a duration of approximately 40 seconds, is performed on the surface of the semiconductor wafer 30. A first cleaning solution, comprising deionized water (DI water) containing ozone, or a solution of sulfuric acid ($H_2SO_4$) and hydrogen peroxide ($H_2O_2$), is sprayed onto the surface of the semiconductor wafer 30 via the first nozzle 34 to remove polymers and organic components on the surface of the semiconductor wafer 30.

A second cleaning process, utilizing a horizontal rotational rate of the semiconductor wafer 30 ranging from 1000 to 2000 rpm and having a duration of approximately 20 seconds, is performed on the surface of the semiconductor wafer 30. A second cleaning solution, comprising DI water, is sprayed onto the surface of the semiconductor wafer 30 to remove the residual first cleaning solution on the surface of the semiconductor wafer 30.

A third cleaning process, utilizing a horizontal rotational speed of the semiconductor wafer 30 ranging from 500 to 2500 rpm and having a duration of approximately 40 seconds, is performed on the surface of the semiconductor wafer 30. A third cleaning solution, comprising a standard cleaning solution (SC-1), or a solution of ammonia ($NH_3$) and hydrogen peroxide, is sprayed onto the surface of the semiconductor wafer 30 via the second nozzle 36 to remove particles on the surface of the semiconductor wafer 30.

A fourth cleaning process, utilizing a horizontal rotational speed of the semiconductor wafer 30 ranging from 500 to 2000 rpm and having a duration of approximately 20 seconds, is performed on the surface of the semiconductor wafer 30. A fourth cleaning solution, comprising DI water, is sprayed onto the surface of the semiconductor wafer 30 via the third nozzle 38 to remove the residual third cleaning solutions from the surface of the semiconductor wafer 30.

Finally, the semiconductor wafer 30 is spun dry at a horizontal rotational speed ranging from 2000 to 2500 rpm for approximately 20 seconds. Consequently, the method of removing the photoresist layer 32 from the surface of the semiconductor wafer 30, including the ashing process, the first, second, third and fourth cleaning processes and the spin-dry process, in the present invention has a duration less than 3 minutes.

In another embodiment of the present invention, the semiconductor wafer 30 is placed on the rotator 40 of the wet clean chamber and rotated horizontally at a speed ranging from 500 to 2500 rpm after the ashing process. A cleaning process, using SC-1 as a cleaning solution, is performed to spray the cleaning solution onto the surface of the semiconductor wafer 30 for approximately 30 seconds so as to remove polymers, organic components and particles from the surface of the semiconductor wafer 30. The residual solution on the surface of the semiconductor wafer 30 is then removed by spraying DI water onto the surface of the semiconductor wafer for 15 seconds. Finally, the semiconductor wafer 30 is spun dry at a horizontal rotational speed ranging from 2000 to 2500 rpm for approximately 15 seconds. The duration of removing the photoresist layer 32 on the surface of the semiconductor wafer 30 in this embodiment is approximately 2 minutes.

In comparison with the prior, the present invention is to remove the photoresist layer by spraying the first, second and third cleaning solutions onto the surface of the rotating semiconductor wafer instead of by rinsing the semiconductor wafer according to the prior art. In a production with a small quantity, such as a pilot-run production with a quantity of only single or few semiconductor wafers, the duration of removing the photoresist layer on the semiconductor wafer is only approximately 4 minutes for each piece. By arranging and selecting different cleaning solutions, the duration is further reduced to only approximately 2 minutes. Thus the production efficiency is significantly improved, and the production cost is consequently reduced.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of removing a photoresist layer on a semiconductor wafer, the method comprising:

providing a semiconductor wafer with a photoresist layer and polymers atop;

performing a first cleaning process to remove polymers and organic components on a surface of the semiconductor wafer by spraying a first cleaning solution on the surface of the semiconductor wafer the first cleaning solution being either deionized water (DI water) containing ozone, or a solution of sulfuric acid ($H_2SO_4$) and hydrogen peroxide ($H_2O_2$);

using a second cleaning solution to perform a second cleaning process to remove the residual first cleaning solution on the surface of the semiconductor wafer, the second cleaning solution being DI water;

using a third cleaning solution to perform a third cleaning process to remove particles on the surface of the semiconductor wafer, the third cleaning solution being either a standard cleaning solution (SC-1), or a solution of ammonia ($NH_3$) and hydrogen peroxide;

using a fourth cleaning solution to perform a fourth cleaning process to remove a residual third cleaning solution employed in the third cleaning process, the fourth cleaning solution being DI water; and spin-drying the semiconductor wafer.

2. The method of claim 1 wherein the semiconductor wafer is placed into a dry strip chamber and a dry stripping process is performed on the semiconductor wafer to remove the photoresist layer on the semiconductor wafer before performing the first, second, third and fourth cleaning processes.

3. The method of claim 1 wherein the semiconductor wafer is placed on a rotator of a wet clean chamber to horizontally rotate the semiconductor wafer during the first, second, third and fourth cleaning processes.

4. The method of claim 3 wherein the first and the third cleaning processes both utilize a horizontal rotational rate of the semiconductor wafer that ranges from 500 to 2500 rpm, and the first and the third cleaning processes both have an approximate duration ranging from 10 to 40 seconds.

5. The method of claim 3 wherein the second and the fourth cleaning processes both utilize a horizontal rotational rate of the semiconductor wafer that ranges from 1000 to 2000 rpm, and the second and the fourth cleaning processes both have an approximate duration ranging from 5 to 20 seconds.

6. The method of claim 3 wherein a horizontal rotational rate of the semiconductor wafer in the spin-drying process ranges from 2000 to 2500 rpm, and a duration of the spin-drying process ranges from 10 to 20 seconds.

7. The method of claim 3 wherein the wet cleaning chamber comprises a plurality of nozzles to spray the first, second, third and fourth solutions onto the surface of semiconductor wafer in the first, second, third and fourth cleaning processes, respectively.

8. The method of claim 2 wherein the dry stripping process is an ashing process using a plasma comprising oxygen or ozone to remove the photoresist layer on the semiconductor wafer.

9. A method of removing a photoresist layer on a semiconductor wafer, the method comprising:

performing a dry stripping process to remove the photoresist layer on the semiconductor wafer;

horizontally rotating the semiconductor wafer and performing a wet cleaning process on the semiconductor wafer, the wet cleaning process comprising:

using a first cleaning solution to perform a first cleaning process to remove particles on the surface of the semiconductor wafer, the first cleaning solution being either a standard cleaning solution, or a solution of ammonia and hydrogen peroxide; and using a second cleaning solution to perform a second cleaning process to remove a first cleaning solution employed in the first cleaning process, the second cleaning solution being DI water, and spin-drying the semiconductor wafer.

10. The method of claim 9 wherein the dry stripping process is an ashing process.

11. The method of claim 10 wherein the ashing process uses a plasma comprising oxygen or ozone to remove the photoresist layer on the semiconductor wafer.

12. The method of claim 9 wherein the first cleaning process utilizes a horizontal rotational rate of the semiconductor wafer that ranges from 500 to 2500 rpm and has an approximate duration ranging from 10 to 40 seconds.

13. The method of claim 9 wherein a horizontal rotational rate of the semiconductor in the second cleaning process ranges from 1000 to 2000 rpm, and a duration of the second cleaning process ranges from 5 to 20.

14. The method of claim 9 wherein a horizontal rotational rate of the semiconductor wafer in the spin-drying process ranges from 2000 to 2500 rpm, and a duration of the spin-drying process ranges from 10 to 20 seconds.

* * * * *